(12) United States Patent
Matsui

(10) Patent No.: US 8,503,496 B2
(45) Date of Patent: Aug. 6, 2013

(54) DEVICE FOR JUDGING STATE OF SEMICONDUCTOR LASER AND METHOD FOR JUDGING STATE OF SEMICONDUCTOR LASER

(75) Inventor: Jun Matsui, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 7 days.

(21) Appl. No.: 13/094,968

(22) Filed: Apr. 27, 2011

(65) Prior Publication Data

US 2012/0008656 A1    Jan. 12, 2012

(30) Foreign Application Priority Data

Jul. 7, 2010  (JP) .................................. 2010-155265

(51) Int. Cl.
   *H01S 3/00*        (2006.01)
(52) U.S. Cl.
   USPC ..................................... 372/38.09; 372/38.02
(58) Field of Classification Search
   USPC ........................................... 372/38.02, 38.09
   See application file for complete search history.

(56) References Cited

U.S. PATENT DOCUMENTS 5,546,221 A * 8/1996 Harasawa ................. 359/341.44
2010/0103971 A1 * 4/2010 Then et al. ................. 372/45.01

FOREIGN PATENT DOCUMENTS

| JP | 57187985 A | * 11/1982 |
| JP | 8-111554 | 4/1996 |
| JP | 2009-26889 | 2/2009 |

* cited by examiner

*Primary Examiner* — Yuanda Zhang
(74) *Attorney, Agent, or Firm* — Staas & Halsey LLP

(57) ABSTRACT

A device includes: a providing unit that provides a driving electric current to a semiconductor laser, the electric current being superimposed a first alternating current signal having a first frequency at a low side of an operational range of the semiconductor laser and a second alternating current signal having a second frequency at a high side of the operational range; a first filter that extracts a first component corresponding to the first frequency from a voltage to be applied to the semiconductor laser; a second filter that extracts a second component corresponding to the second frequency from the voltage to be applied to the semiconductor laser; and a judge circuit that judges a state of the semiconductor laser based on a first differential resistance obtained from the result of the extracting by the first filter and a second differential resistance obtained from the result of the extracting by the second filter.

8 Claims, 6 Drawing Sheets

DEVICE FOR JUDGING STATE OF SEMICONDUCTOR LASER AND METHOD FOR JUDGING STATE OF SEMICONDUCTOR LASER

CROSS-REFERENCE TO RELATED APPLICATION

This application is based upon and claims the benefit of priority of the prior Japanese Application No. 2010-155265 filed on Jul. 7, 2010 in Japan, the entire contents of which are hereby incorporated by reference.

FIELD

The embodiments discussed herein are related to a device for judging a state of a semiconductor laser and a method for judging a state of a semiconductor laser.

BACKGROUND

In accordance with recent increase in communication capacity, systems using optical signals are becoming widespread, which arises an important issue to ensure the reliability of optical devices used in the systems and which demands a technique of predicting a possible failure of the optical devices.

Conventionally, typical detection of a prospective failure of a semiconductor laser (Laser Diode, LD) has used a Photo Detector (PD). Specifically, part of light emitted from a semiconductor laser is received by a PD, which detects a degree of deterioration in optical power to predict a prospective failure. However, the above scheme using a PD is accomplished by an exterior circuit on which the PD is optically mounted, thereby increasing the costs.

For the above, there has been proposed a method of detecting a failure of a semiconductor laser by measuring the differential resistance of the semiconductor (e.g., see Patent Literature 1). The technique of Patent Literature 1 compares a differential resistance obtained by monitoring and a differential resistance threshold for judging a failure in order to judge a prospective failure (deterioration).

Patent Literature 1: Japanese Laid-open Patent Publication No. 2009-26889

However, the technique of Patent Literature 1 unstably measures a differential resistance of a semiconductor laser, which may result in a large variation of the measured differential resistance. In addition, a differential resistance varies for each individual semiconductor laser, which requires a modification of a value of the judgment.

SUMMARY (1) According to an aspect of the embodiments, an apparatus includes a device for judging a state of a semiconductor laser, the device including: a providing unit that provides a driving electric current to the semiconductor laser, the electric current being superimposed a first alternating current signal having a first frequency at a low side of an operational range of the semiconductor laser and a second alternating current signal having a second frequency different from the first frequency at a high side of the operational range; a first filter that extracts a first component corresponding to the first frequency from a voltage to be applied to the semiconductor laser; a second filter that extracts a second component corresponding to the second frequency from the voltage to be applied to the semiconductor laser; and a judge circuit that judges a state of the semiconductor laser based on a first differential resistance obtained from the result of the extracting by the first filter and a second differential resistance obtained from the result of the extracting by the second filter.

(2) According to an aspect of the embodiments, a method includes a method for judging a state of a semiconductor, the method including: providing a driving electric current to the semiconductor laser, the electric current being superimposed a first alternative current signal having a first frequency at a Low side of an operational range of the semiconductor laser and a second alternating current signal having a second frequency different from the first frequency at a High side of the operational range; extracting a first component corresponding to the first frequency from voltage to be applied to the semiconductor laser; extracting a second component corresponding to the second frequency from the voltage to be applied to the semiconductor laser; and judging a state of the semiconductor laser based on a first differential resistance obtained from the extracted first component and a second differential resistance obtained from the extracted second component.

The object and advantages of the embodiment will be realized and attained by means of the elements and combinations particularly pointed out in the claims.

It is to be understood that both the foregoing general description and the following detailed description are exemplary and explanatory and are not restrictive of the embodiment, as claimed.

DESCRIPTION OF EMBODIMENTS

Hereinafter, description will now be made in relation to the accompanying drawings.

(1) First Embodiment

Figure 1:
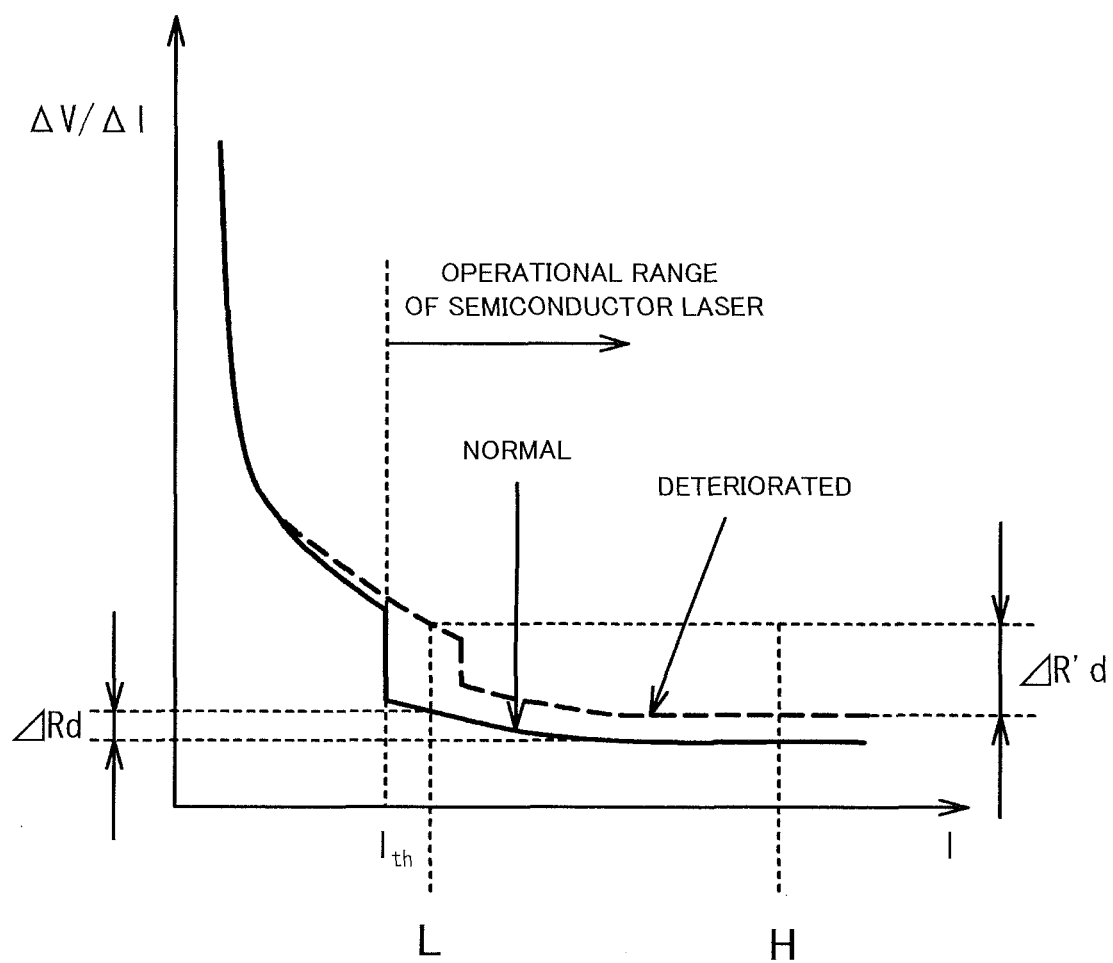
FIG. 1 is a diagram illustrating a variation in differential resistance of a semiconductor laser.

For the beginning, description will be made in relation to the properties of a differential resistance of a semiconductor laser. FIG. 1 is a diagram illustrating a variation in differential resistance of a semiconductor laser. In FIG. 1, the horizontal axis of a graph represents an operational electric current to be provided to a semiconductor laser; and the vertical axis of the graph represents a differential resistance of the semiconductor laser. The term "differential resistance" means a value obtained through differentiation on a resistance of a semiconductor laser.

In FIG. 1, the solid line represents a differential resistance of a semiconductor laser in a normal state while the broken line represents a differential resistance of a semiconductor laser in an abnormal state (e.g., due to deterioration). By referring to FIG. 1, when the operational electric current provided to the semiconductor laser in a normal state comes to be the oscillation threshold $I_{th}$ (the oscillation threshold of a normal semiconductor laser), the differential resistance drastically declines so that light is emitted to generate laser oscillation. After that, in spite of increase of the operational electric current, the differential resistance scarcely lowers. Accordingly, in a range of an electric current (the range of operation of the semiconductor laser) exceeding the oscillation threshold $I_{th}$, the difference $\Delta Rd$ of the differential resistance against the operational electric current at the Low side from that at the High side is small.

As a semiconductor deteriorates, laser oscillation is not generated unless the operational electric current is not increased. In other words, as a semiconductor laser deteriorates, the oscillation threshold increases. In this case, the operational electric current at the Low side lower than the oscillation threshold causes the difference $\Delta R'd$ of the differential resistance against the operational electric current at the Low side from that at the High side to be large. As the above, when a semiconductor laser is in an abnormal state due to, for example, deterioration, the differential resistance at the Low side becomes relatively large to that at the High side. Therefore, the state of a semiconductor laser is judged on the basis of the above property.

Specifically, when the difference $\Delta Rd$ of the differential resistance exceeds a predetermined reference value $\Delta Rd_{ref}$, the semiconductor laser can be judged to be in an abnormal state. Conversely, when difference $\Delta Rd$ of the differential resistance does not exceed the predetermined reference value $\Delta Rd_{ref}$, the semiconductor laser can be judged to be in a normal state because the oscillation threshold is not larger than a predetermined value. Namely, the state of a semiconductor laser can be judged on the basis of the difference $\Delta Rd$ of the differential resistance.

Alternatively, the state of a semiconductor laser can be determined on the basis of the ratio of a differential resistance at the Low side to a differential resistance at the High side. Specifically, when a ratio of the differential resistance at the Low side to the differential resistance at the High side is a predetermined value or more, the differential resistance at the Low side is relatively large to that of the High side. Accordingly, when the above ratio is larger than a predetermined value, the semiconductor laser can be judged to be in an abnormal state.

As the above, a state of a semiconductor laser can be judged through the use of a parameter capable of judging whether or not the differential resistance at the Low side is relatively large to the differential resistance at the High side.

Figure 2:
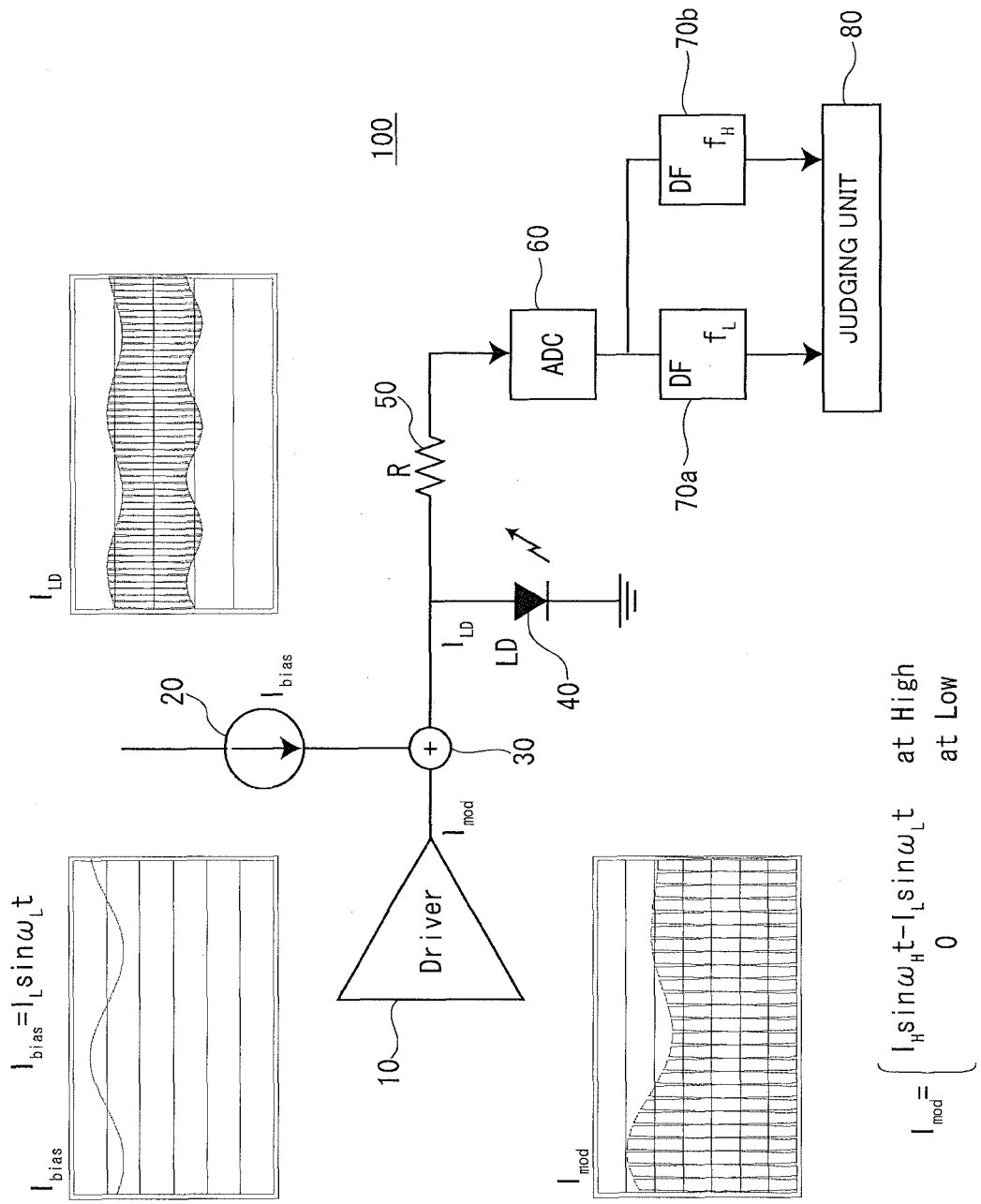
FIG. 2 is a block diagram illustrating the entire configuration of a device for judging a state of a semiconductor laser according to a first embodiment.

A device 100 for judging a state of a semiconductor laser to be detailed below detects a state of a semiconductor laser on the basis of, for example, a detected difference $\Delta Rd$ of a differential resistance. FIG. 2 is a block diagram illustrating the entire configuration of the device 100 of the first embodiment. As illustrated in FIG. 2, the device 100 includes a driver circuit 10, a bias electric source 20, an adder 30, a semiconductor laser 40, a resistor 50, an ADC (Analog-to-Digital Convertor) 60, digital filters 70a and 70b, and a judging unit 80. For example, the judging unit 80 may be a circuit, a FPGA (Field-Programmable Gate Array), or a processor.

The driver circuit 10 generates and outputs a modulated electric current $I_{mod}$, which varies with an input digital signal. The driver circuit 10 is direct-current coupled to the semiconductor laser 40. The bias electric source 20 generates a bias electric current $I_{bias}$ that is to supply a bias electric current to the semiconductor laser 40. The adder 30 adds the modulated electric current $I_{mod}$ and the bias electric current $I_{bias}$ to generate and output a driving electric current $I_{LD}$ to activate the semiconductor laser 40. The semiconductor laser 40 has an oscillation threshold, and is exemplified by a direct-modulation Vertical Cavity Surface Emitting Laser (VCSEL).

The resistor 50 has a predetermined resistance value. The ADC 60 converts an analog signal input via the resistor 50 into a digital signal, and outputs the digital signal to the digital filters 70a and 70b. The digital filters 70a and 70b function as a voltmeter that detects the voltage applied to the semiconductor laser 40, and detect respective predetermined frequency components and output the components to the judging unit 80. The judging unit 80 calculates a difference $\Delta Rd$ of a differential resistance at the Low side from a differential resistance at the High side of the semiconductor laser 40 on the basis of the frequency components input from the digital filters 70a and 70b.

Figure 3:
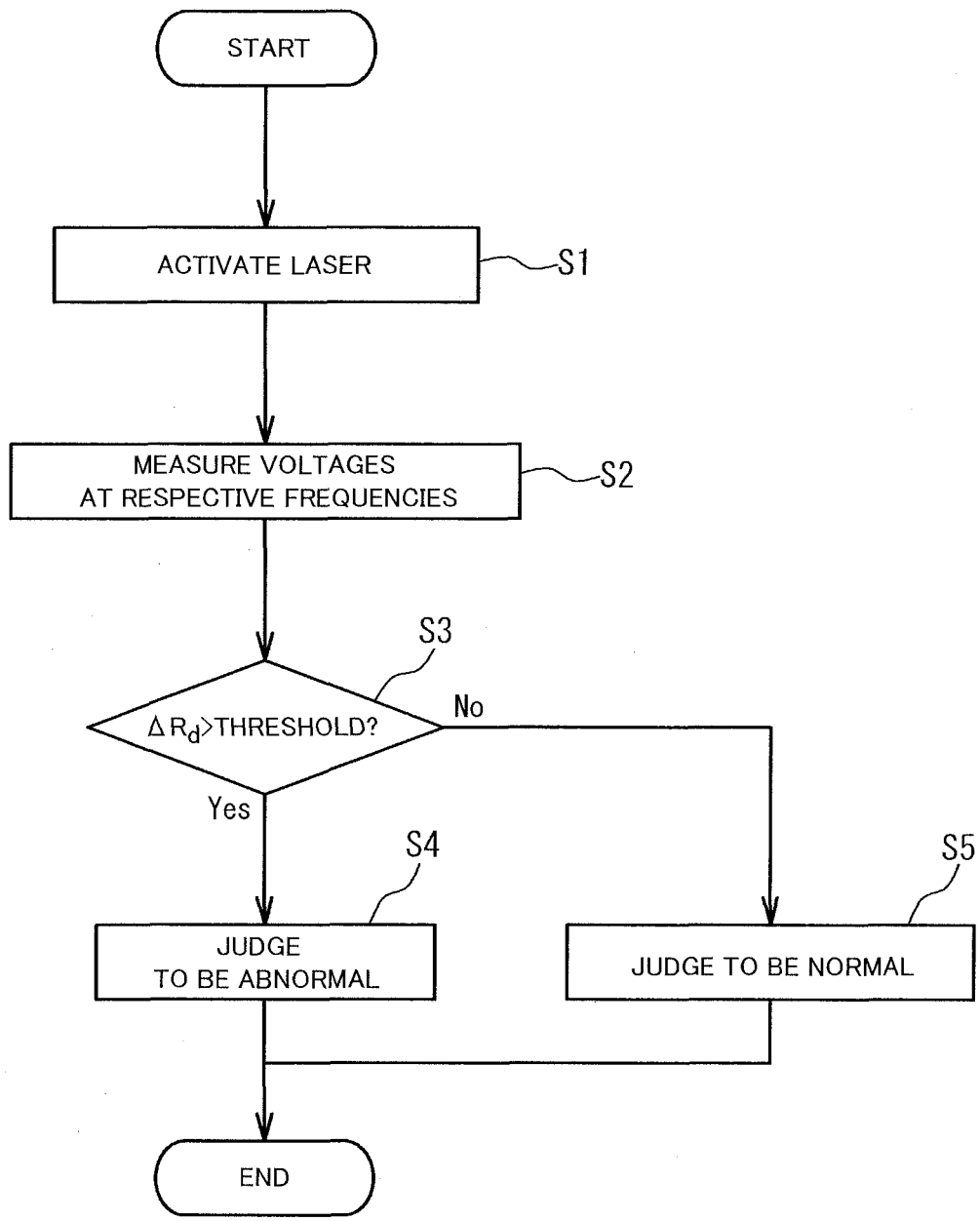
FIG. 3 is a flow chart illustrating an example of a procedure of judging a state of a semiconductor laser.

Hereinafter, description will now be made in relation to a method of judging a state of the semiconductor laser 40, using specific mathematical formulae, with reference to FIGS. 2 through 5. FIG. 3 is a flow diagram illustrating an example of a procedure of judging a state of the semiconductor laser 40. As illustrated in FIG. 3, the driver circuit 10 activates the semiconductor laser 40 in response to a digital signal input into the driver circuit 10 (step S1).

Figure 4:
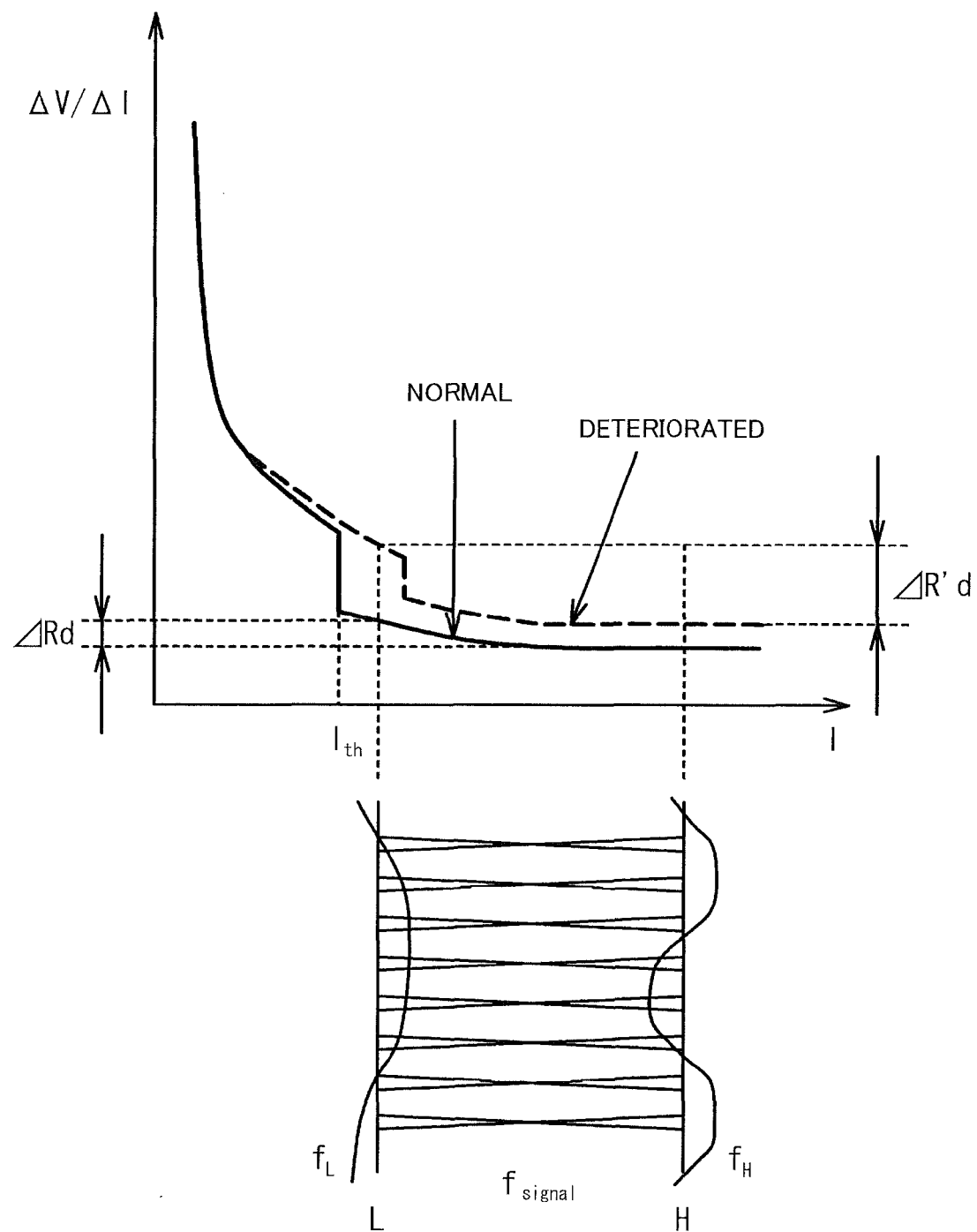
FIG. 4 is a diagram illustrating an AC signal to be superimposed on a driving signal.

Referring to FIG. 4, the first embodiment uses the driving electric current $I_{LD}$ on which an AC signal having a first frequency $f_L$ is superimposed for the Low side and an AC signal having a second frequency $f_H$ different from the first frequency $f_L$ is superimposed for the High side. In order to superimpose an AC signal at the Low side, the bias electric current $I_{bias}$ is exemplarily set as Formula (1) below. In the meanwhile, in order to superimpose an AC signal at the High side, the modulated electric current $I_{mod}$ is exemplarily set as Formulae (2) and (3) below. In Formulae (2) and (3), "$\omega_L$" represents an angular frequency corresponding to a first frequency $f_L$; and "$\omega_H$" represents an angular frequency corresponding to a second frequency $f_H$. Accordingly, the angular frequencies $\omega_H$ and $\omega_L$ are different from each other.

$$I_{bias} = I_L \sin \omega_L t \tag{1}$$

$$I_{mod} \text{ (at High)} = I_H \sin \omega_H t - I_L \sin \omega_L t \tag{2}$$

$$I_{mod} \text{ (at Low)} = 0 \tag{3}$$

For the above, the driving electric current $I_{LD}$ has predetermined amplitudes at both High and Low sides. The voltage to be applied to the semiconductor laser 40 varies with the Low side and the High side of the driving electric current $I_{LD}$. Here, a variation in of the driving electric current $I_{LD}$ at the High side is presented by $\Delta I_{High}$; and a variation in the driving electric current $I_{LD}$ at the Low side is presented by $\Delta I_{Low}$. The difference in voltage of the driving electric current $I_{LD}$ at the High side is represented by $\Delta V_{High}$; and the difference in voltage of the driving electric current $I_{LD}$ that at the Low side is represented by $\Delta V_{Low}$. In this case, the differential resistance $Rd_{Low}$ obtained from the Low side of the driving electric current $I_{LD}$ is expressed by following Formula (4) while the differential resistance $Rd_{High}$ of the High side of the driving electric current $I_{LD}$ is expressed by following formula (5).

$$Rd_{Low} = \Delta V_{Low} / \Delta I_{Low} \tag{4}$$

$$Rd_{High} = \Delta V_{High} / \Delta I_{High} \tag{5}$$

Figure 5:
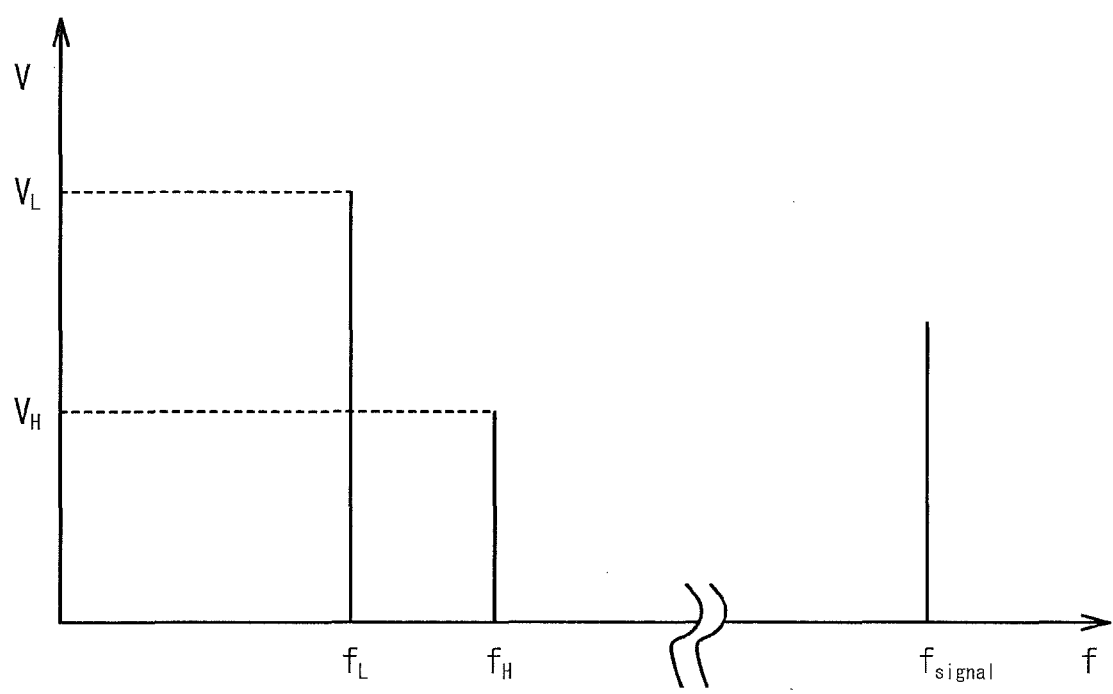
FIG. 5 is a diagram illustrating voltages corresponding to respective frequency components.

The digital filter 70a of the first embodiment is configured to extract the frequency component of the first frequency $f_L$ through spectral resolution; and the digital filter 70b is configured to extract the frequency component of the second frequency $f_H$ through spectral resolution. Accordingly, the digital filters 70a and 70b detect voltages corresponding to the respective frequency components (step S2) as illustrated in FIG. 5. On the basis of the detected voltages $V_L$ and $V_H$, and the amplitudes set for AC components of the High side and the Low side, the judging unit 80 calculates a differential resistance $Rd_{Low}$ at the Low side and a differential resistance $RD_{High}$ at the High side. The voltage $V_L$ represents one at the Low side and the voltage $V_H$ represents one at the High side.

The judging unit 80 judges whether or not the difference $\Delta Rd(=Rd_{Low}-Rd_{High})$ between the differential resistance $Rd_{Low}$ and the differential resistance $Rd_{High}$ exceeds a predetermined threshold (reference value $\Delta Rd_{ref}$) (step S3). When the difference $\Delta Rd$ exceeds the threshold, the judging unit 80 judges the semiconductor laser 40 to be in an abnormal state (step S4). In the meantime, when the difference $\Delta Rd$ is the threshold or less, the judging unit 80 judges the semiconductor laser 40 to be in a normal state (step S5).

Since the first embodiment calculates the difference of the differential resistances, it is possible to mitigate influence caused by inaccuracy in measuring the differential resistances. In addition, comparing the differential resistance of the semiconductor laser 40 in a normal state and the differential resistance of the semiconductor laser 40 when the measuring, it is possible to mitigate variation in the differential resistance of each individual semiconductor laser. The above can improve the accuracy of judging the state of a semiconductor laser. In addition, the first embodiment can obtain the differential resistance while the semiconductor laser is operating, eliminating the requirement for stopping the operation of the semiconductor laser to judge the state thereof.

Here, the first frequency $f_L$ and the second frequency $f_H$ are preferably smaller than the frequency $f_{signal}$ of the digital signal of the driving electric current $I_{LD}$. Furthermore, the AC signals of the first frequency $f_L$ and the second frequency $f_H$ preferably have amplitudes smaller than the modulation amplitude of the driving electric current $I_{LD}$. These are because the influence of the AC signals of the first frequency $f_L$ and the second frequency $f_H$ can be suppressed on the driving electric current $I_{LD}$.

The Low side of the driving electric current $I_{LD}$ is preferably set to exceed the oscillation threshold $I_{th}$ of the semiconductor laser 40 in the normal state and to be less than an oscillation threshold of the semiconductor laser 40 being deteriorated. The oscillation threshold of the semiconductor laser 40 being deteriorated can be set beforehand. The High side of the driving electric current $I_{LD}$ is preferably set to exceed the above oscillation threshold of the semiconductor laser 40 being deteriorated.

(2) Second Embodiment

Figure 6:
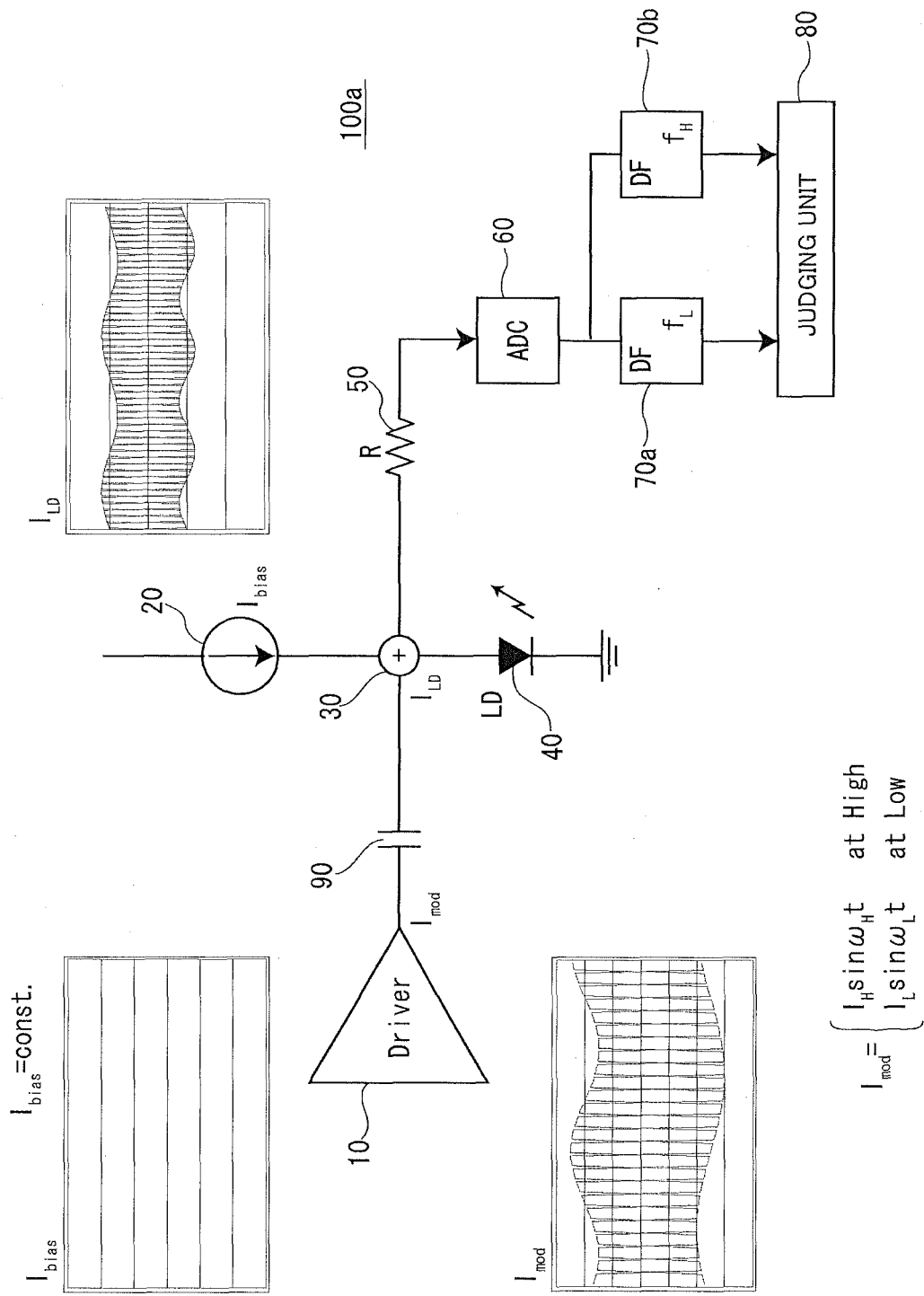
FIG. 6 is a block diagram illustrating the entire configuration of a device for judging a state of a semiconductor laser according to a second embodiment.

FIG. 6 is a block diagram illustrating the entire configuration of a device 100a for judging a state of a semiconductor laser according to the second embodiment. The device 100a is different from the device 100 of the first embodiment in the points that a capacitor 90 is disposed between the driver circuit 10 and the adder 30 and that the driver circuit 10 is alternating-current coupled to the semiconductor laser 40. In the second embodiment, the bias electric current $I_{bias}$ is set to be constant, and an AC signal can be superimposed onto both Low side and High side of the modulation signal $I_{mod}$ in the driver circuit 10.

Under the above configuration, frequencies to be superimposed on the Low side and the High side being different from each other can obtain the differential resistances on the basis of both Low side and High side. On the basis of these differential resistances, the accuracy in judging the state of a semiconductor laser can be improved.

In the foregoing embodiments, the driver circuit 10 and the bias electric source 20 functions as a driving electric current providing unit. The digital filter 70a functions as a first filter that extracts the first frequency components while the digital filter 70b functions as a second filter that extracts the second frequency components. The judging unit 80 functions as a judging unit that judges the state of the semiconductor laser. For example, the judging unit 80 may be a circuit, a FPGA (Field-Programmable Gate Array), or a processor.

The first and second embodiments of the present invention are described above, but the present invention is not limited to the foregoing embodiments. Various changes and modifications can be suggested without departing from the gist described in the claims for patent.

A device for judging a state of a semiconductor laser and a method for judging a state of a semiconductor laser disclosed in the specification can improve the accuracy in judging a state of a semiconductor laser.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments have been described in detail, it should be understood that the various changes, substitutions, and alterations could be made hereto without departing from the spirit and scope of the invention.

What is claimed is:

1. A device for judging a state of a semiconductor laser, the device comprising:
   a providing unit that provides a driving electric current to the semiconductor laser, the electric current being superimposed a first alternating current signal having a first frequency at a low side of an operational range of the semiconductor laser and a second alternating current signal having a second frequency different from the first frequency at a high side of the operational range;
   a first filter that extracts a first component corresponding to the first frequency from a voltage to be applied to the semiconductor laser;
   a second filter that extracts a second component corresponding to the second frequency from the voltage to be applied to the semiconductor laser; and
   a judge circuit that judges a state of the semiconductor laser based on a first differential resistance obtained from the result of the extracting by the first filter and a second differential resistance obtained from the result of the extracting by the second filter,
   wherein the first frequency and the second frequency are smaller than a frequency of a digital signal of the driving electric current.

2. The device according to claim 1, wherein both of a first amplitude of the first alternating current signal and a second amplitude of the second alternating current signal are smaller than a modulation amplitude of the driving electric current.

3. The device according to claim 1, wherein the judge circuit judges the semiconductor laser to be in an abnormal state when a difference of the second differential resistance from the first differential resistance exceeds a threshold.

4. The device according to claim 1, wherein the providing unit comprises:
   a driver circuit that generates a modulated electric current; and a bias electric source that superimposes a bias electric current on the modulated electric current.

5. The device according to claim 4, wherein:

the driver circuit is direct-current coupled to the semiconductor laser;

the bias electric source generates the first alternating current signal;

the driving electric current at the high side is a difference between the first alternating current having the first frequency and the second alternating current having the second frequency.

6. A method for judging a state of a semiconductor laser, the method comprising:

providing a driving electric current to the semiconductor laser, the electric current being superimposed a first alternative current signal having a first frequency at a Low side of an operational range of the semiconductor laser and a second alternating current signal having a second frequency different from the first frequency at a High side of the operational range;

extracting a first component corresponding to the first frequency from voltage to be applied to the semiconductor laser;

extracting a second component corresponding to the second frequency from the voltage to be applied to the semiconductor laser; and judging a state of the semiconductor laser based on a first differential resistance obtained from the extracted first component and a second differential resistance obtained from the extracted second component wherein the first frequency and the second frequency are smaller than a frequency of a digital signal of the driving electric current.

7. The method according to claim 6, wherein both of a first amplitude of the first alternating current signal and a second amplitude of the second alternating current signal are smaller than a modulation amplitude of the driving electric current.

8. The method according to claim 6, wherein the judging determines the semiconductor laser to be in an abnormal state when a difference of the second differential resistance from the first differential resistance exceeds a threshold.

* * * * *